US012796191B2

(12) United States Patent
Oyama et al.

(10) Patent No.: US 12,796,191 B2
(45) Date of Patent: Nov. 10, 2026

(54) LIGHT-EMITTING DEVICE AND IMAGE DISPLAY DEVICE

(71) Applicant: SONY GROUP CORPORATION, Tokyo (JP)

(72) Inventors: Yusuke Oyama, Tokyo (JP); Akira Ohmae, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 340 days.

(21) Appl. No.: 18/578,126

(22) PCT Filed: Mar. 3, 2022

(86) PCT No.: PCT/JP2022/009155
§ 371 (c)(1),
(2) Date: Jan. 10, 2024

(87) PCT Pub. No.: WO2023/007804
PCT Pub. Date: Feb. 2, 2023

(65) Prior Publication Data
US 2024/0332470 A1 Oct. 3, 2024

(30) Foreign Application Priority Data
Jul. 30, 2021 (JP) ................................ 2021-125300

(51) Int. Cl.
*H10H 20/856* (2025.01)
*H10W 90/00* (2026.01)

(52) U.S. Cl.
CPC .......... *H10H 20/856* (2025.01); *H10W 90/00* (2026.01)

(58) Field of Classification Search
None
See application file for complete search history.

(56) References Cited

U.S. PATENT DOCUMENTS

2007/0182323 A1* 8/2007 Ogata .................. H10H 20/854 257/E33.059
2014/0159064 A1* 6/2014 Sakariya ............... H10W 90/00 257/88
(Continued)

FOREIGN PATENT DOCUMENTS

JP 2016-115729 A 6/2016
JP 2019-514217 A 5/2019
(Continued)

OTHER PUBLICATIONS

International Search Report and Written Opinion of PCT Application No. PCT/JP2022/009155, issued on May 24, 2022, 11 pages of ISRWO.

*Primary Examiner* — Sarah K Salerno
(74) *Attorney, Agent, or Firm* — CHIP LAW GROUP

(57) ABSTRACT

A light-emitting device (1) includes a light-emitting element (2), a light-reflective section (3), a lens (5), and a light-shielding section (6). The light-emitting element (2) has a light-emitting surface (2A). The light-reflective section (3) reflects light emitted from the light-emitting surface (2A). The light-reflective section (3) is provided on an opposite side from the light-emitting surface (2A) of the light-emitting element (2) and a side-surface side of the light-emitting element (2). The lens (5) collects the light emitted from the light-emitting surface (2A). The lens (5) is provided on the light-emitting surface (2A) side. The light-shielding section (6) blocks the light emitted from the light-emitting surface (2A). The light-shielding section (6) is provided between the light-emitting surface (2A) and the lens (5) and has an opening (6A) to admit light. The opening (6A) penetrates the light-shielding section (6) in a thickness direction.

19 Claims, 12 Drawing Sheets

(56) References Cited

U.S. PATENT DOCUMENTS

| | | | |
|---|---|---|---|
| 2017/0062674 | A1 | 3/2017 | Kwon et al. |
| 2020/0144228 | A1 | 5/2020 | Brick et al. |

FOREIGN PATENT DOCUMENTS

| | | | |
|---|---|---|---|
| JP | 2019-152851 | A | 9/2019 |
| JP | 2020-057756 | A | 4/2020 |
| JP | 2020-205417 | A | 12/2020 |

* cited by examiner

[ FIG. 1 ]
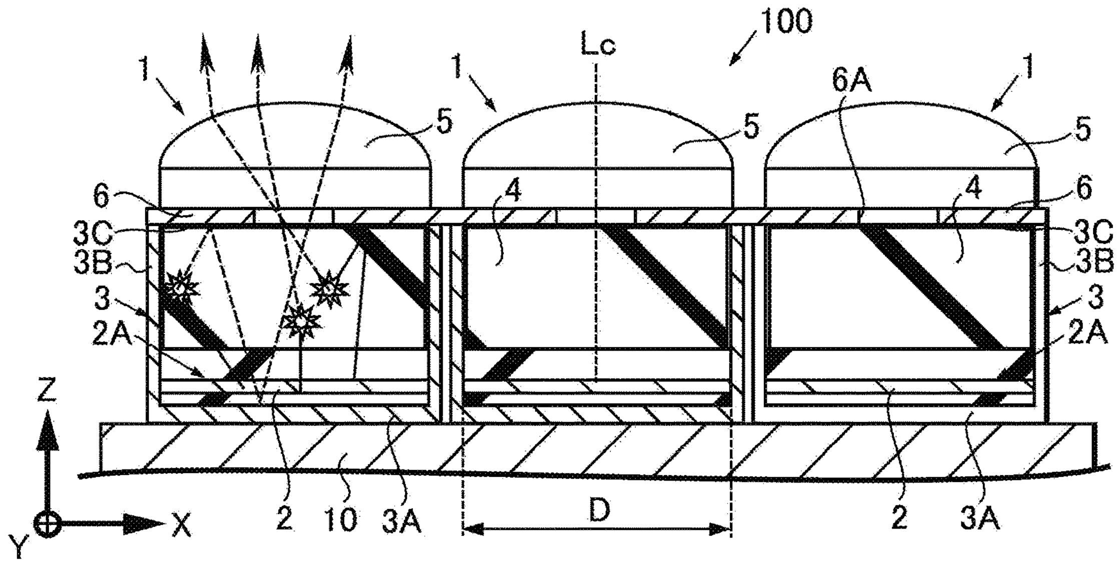
[ FIG. 2 ]
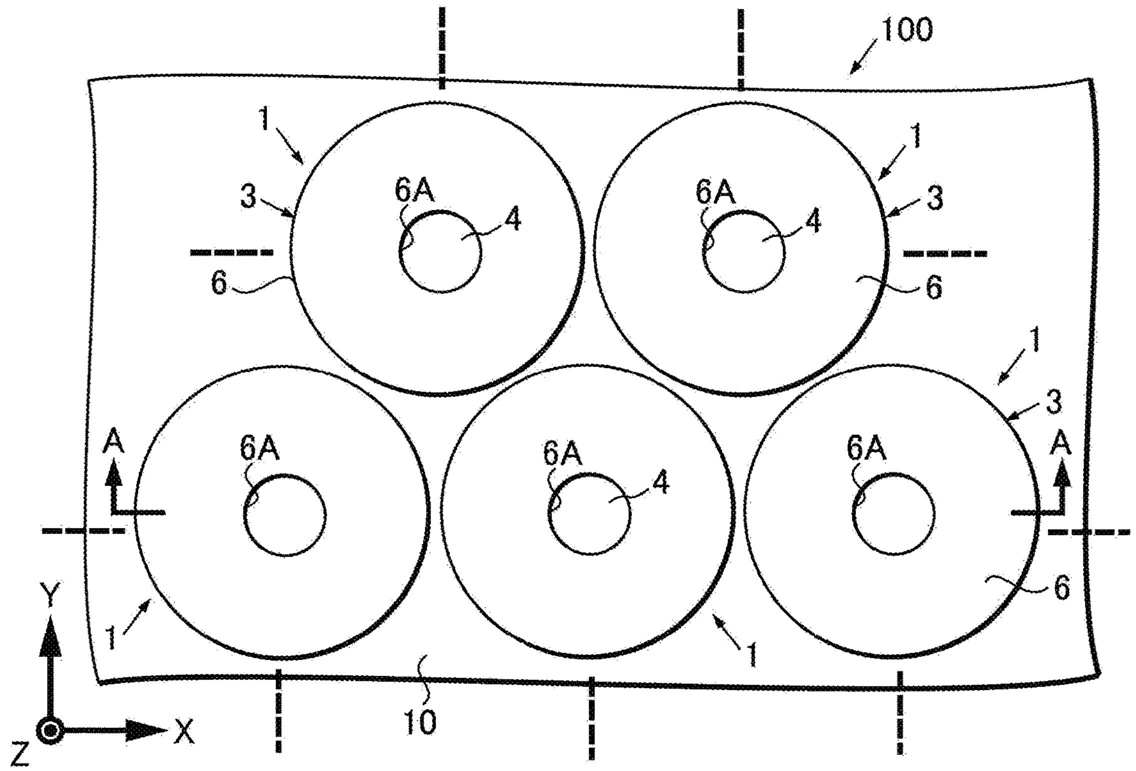

[ FIG. 3 ]
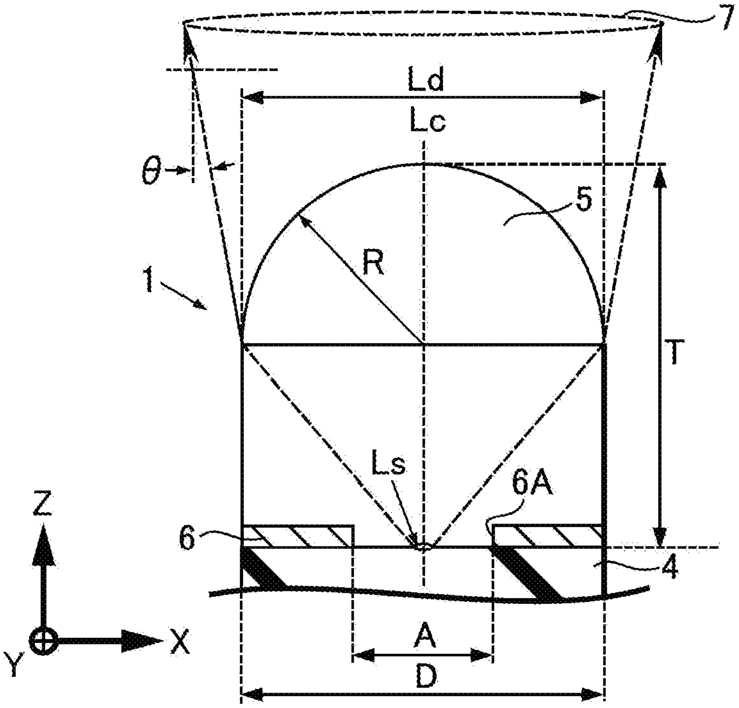
[ FIG. 4 ]
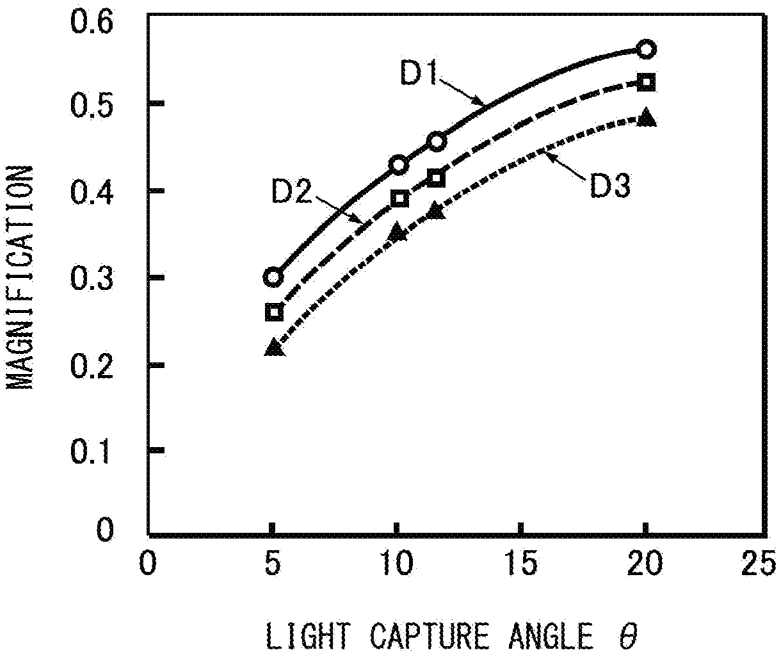

[ FIG. 5A ]
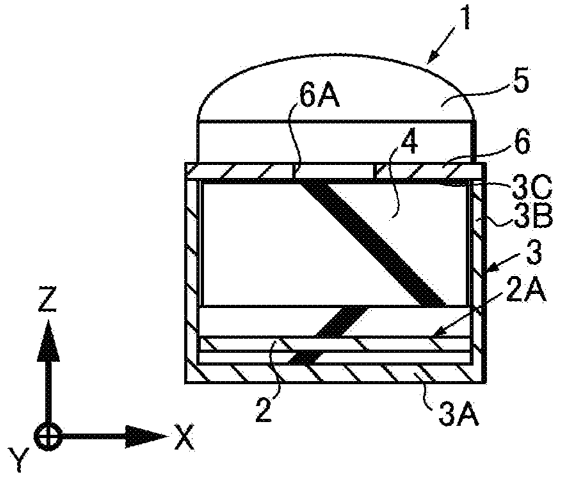
[ FIG. 5B ]
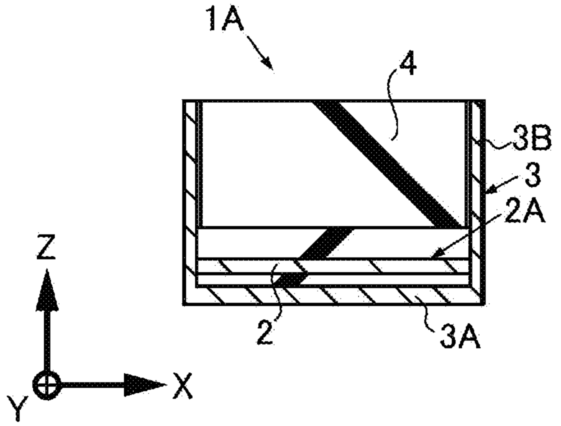
[ FIG. 5C ]
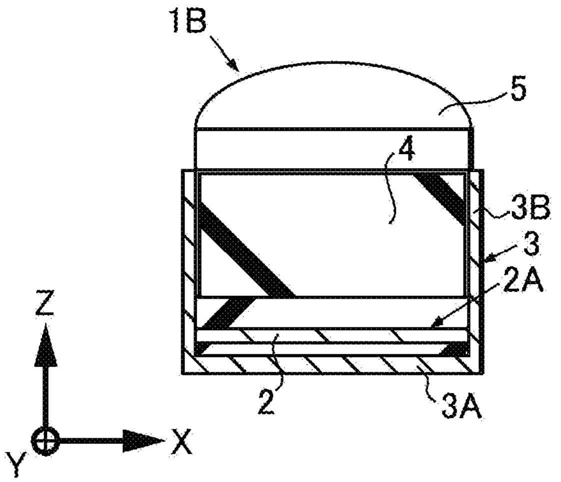

[ FIG. 6 ]
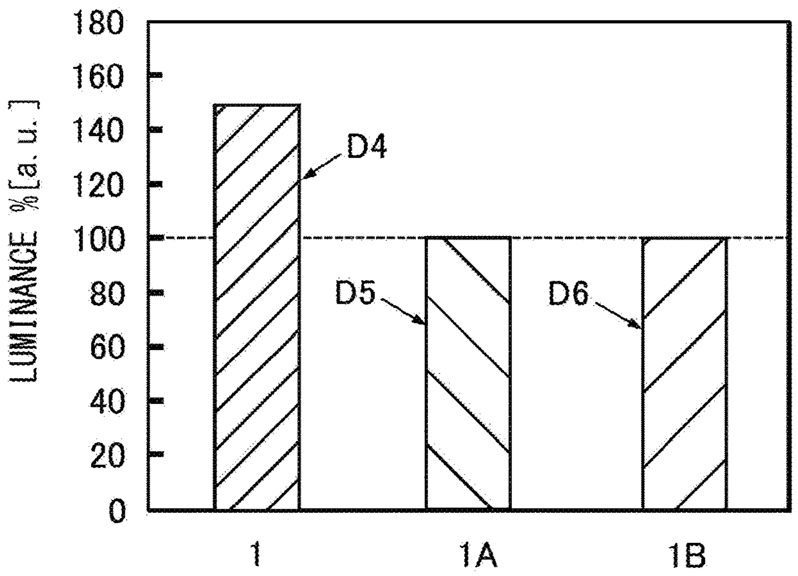
[ FIG. 7 ]
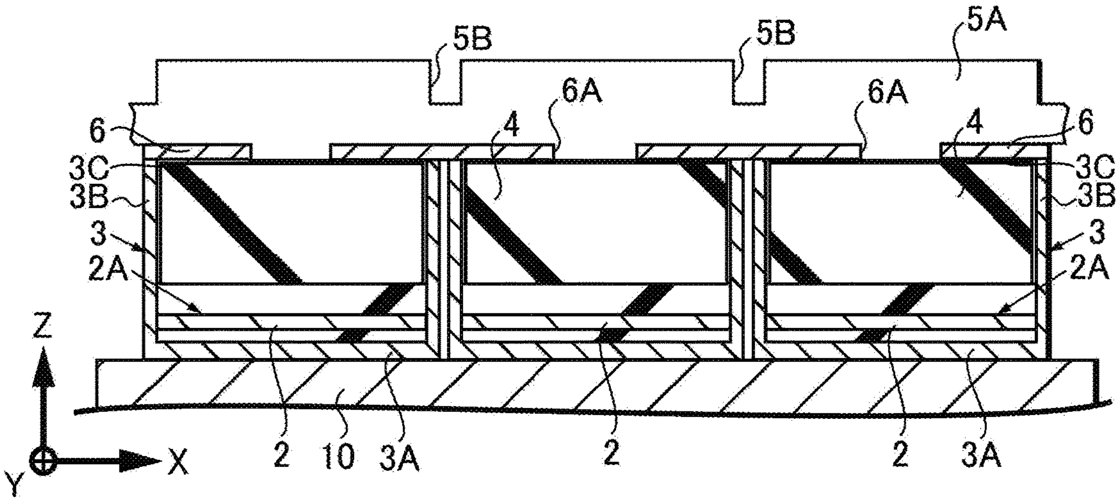

[ FIG. 8 ]
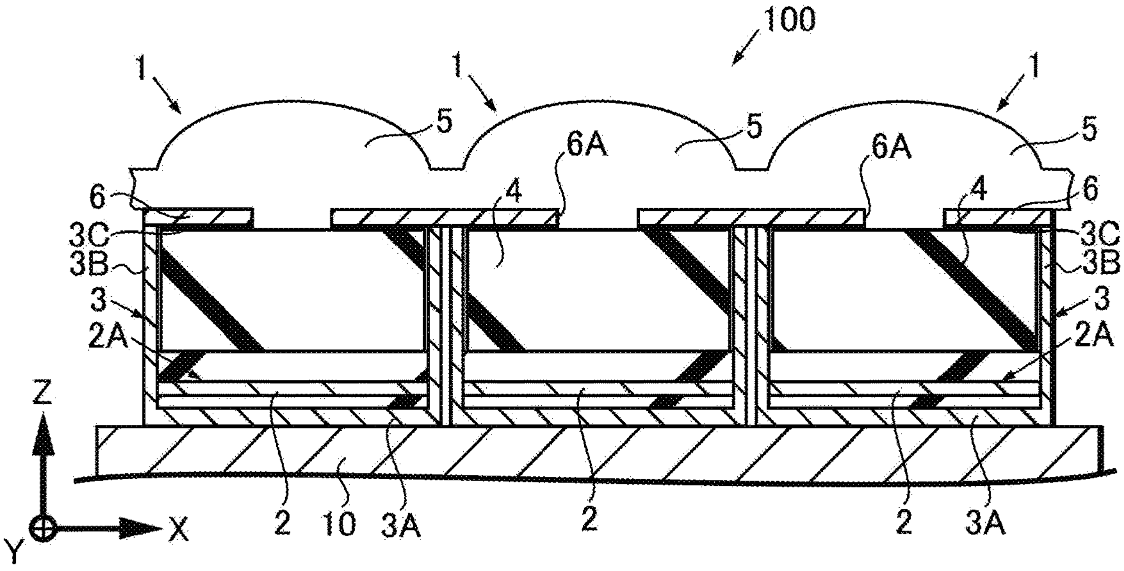
[ FIG. 9 ]
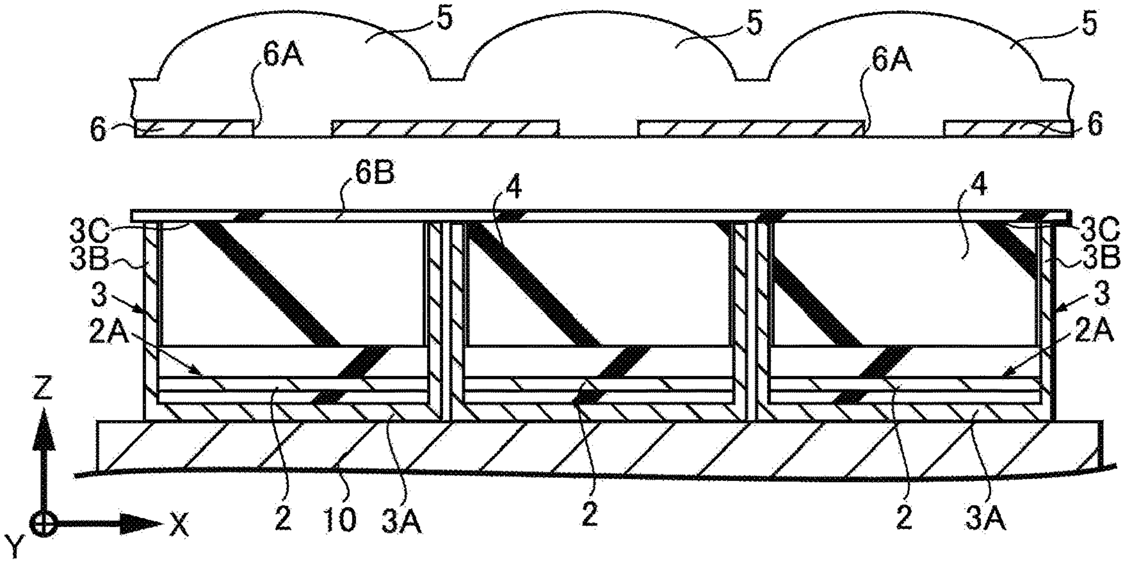

[ FIG. 10 ]
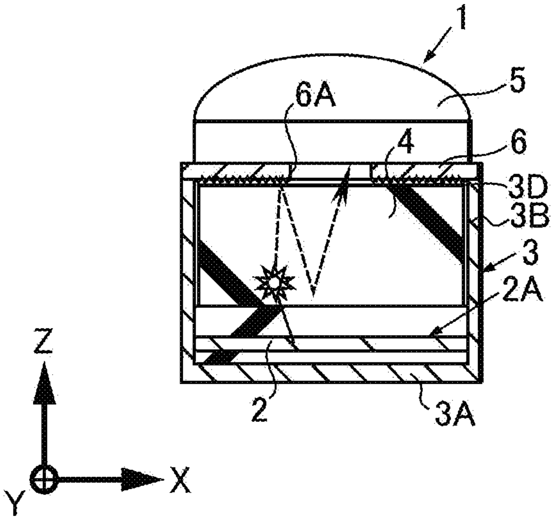
[ FIG. 11 ]
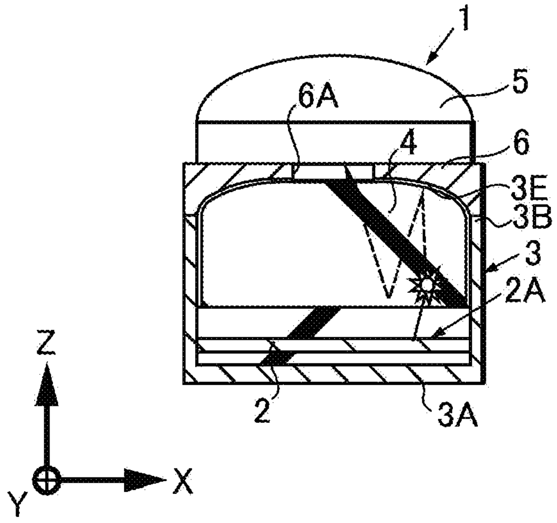

[ FIG. 12 ]
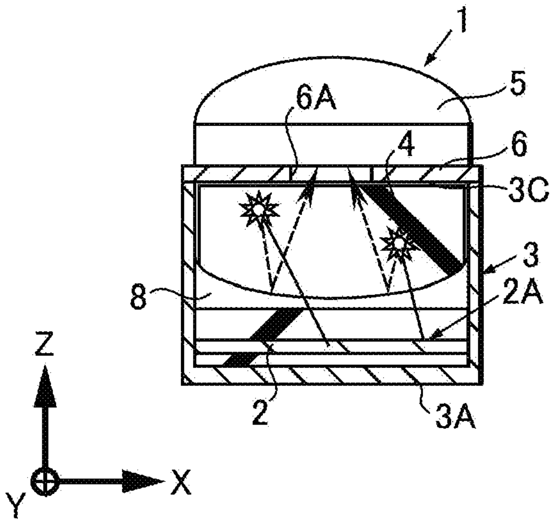
[ FIG. 13 ]
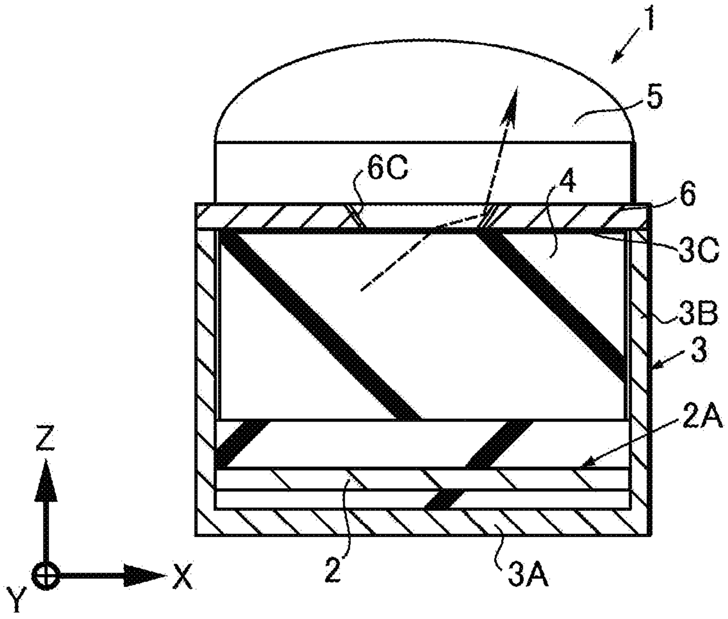

[ FIG. 14 ]
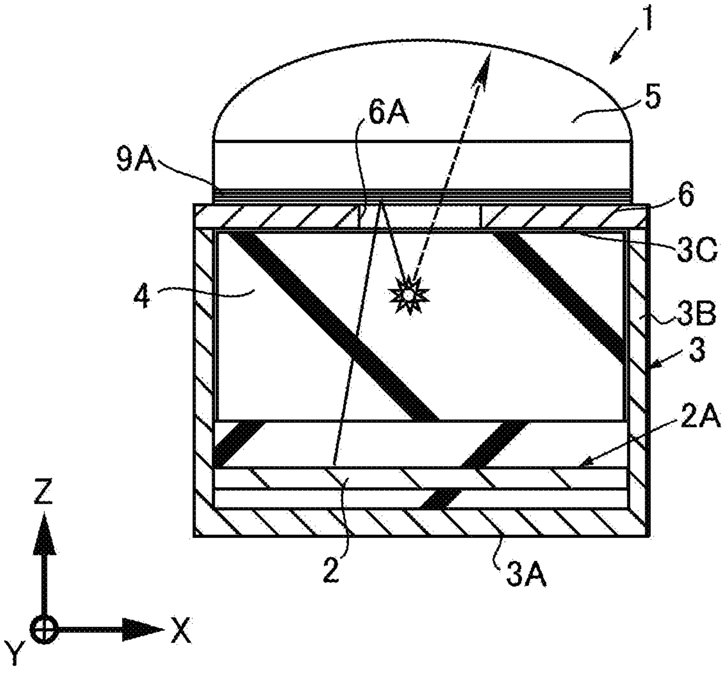
[ FIG. 15 ]
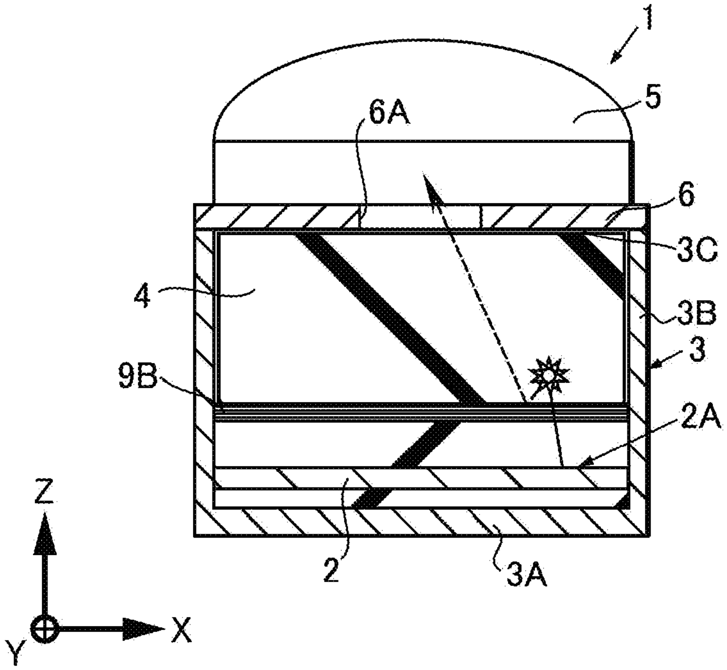

[ FIG. 16A ]
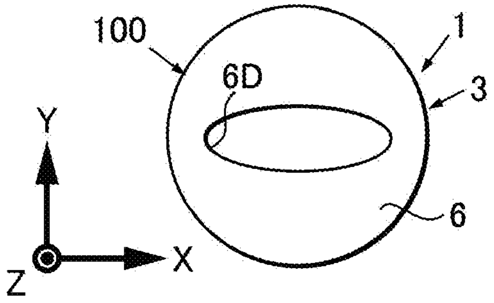
[ FIG. 16B ]
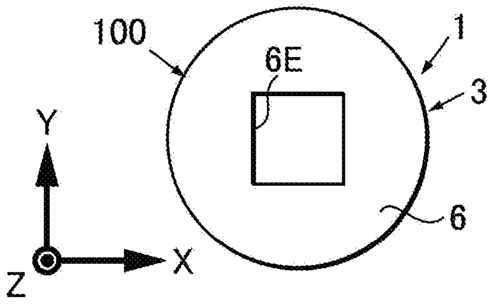
[ FIG. 16C ]
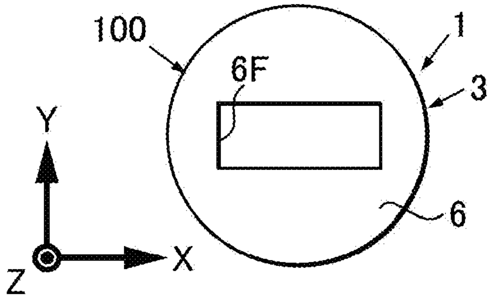
[ FIG. 16D ]
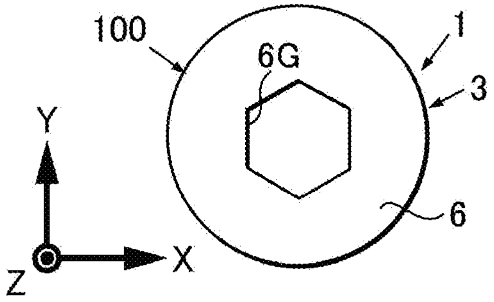

[ FIG. 17 ]
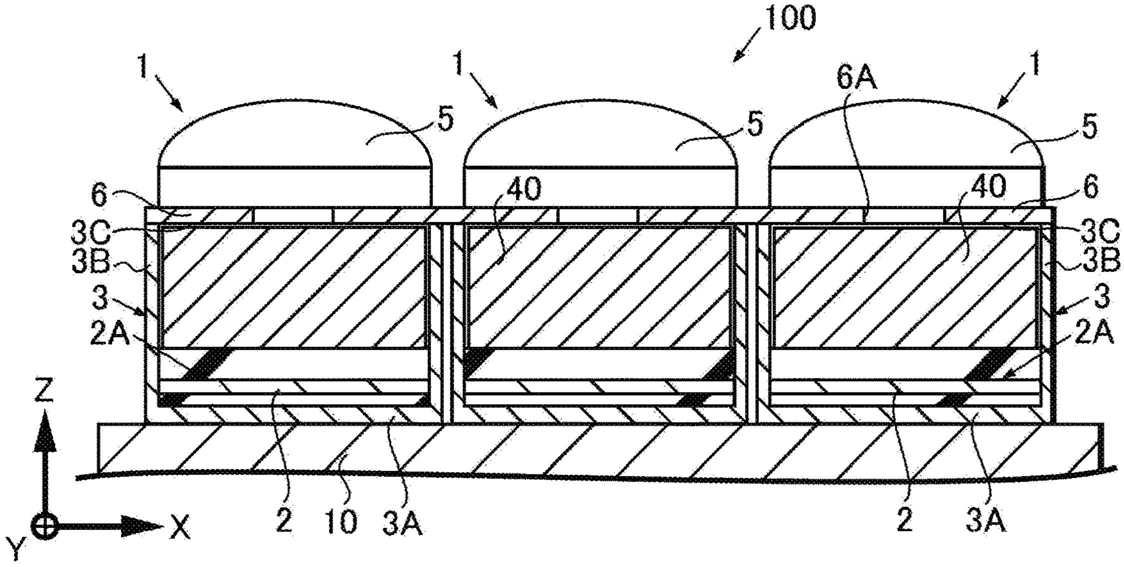
[ FIG. 18 ]
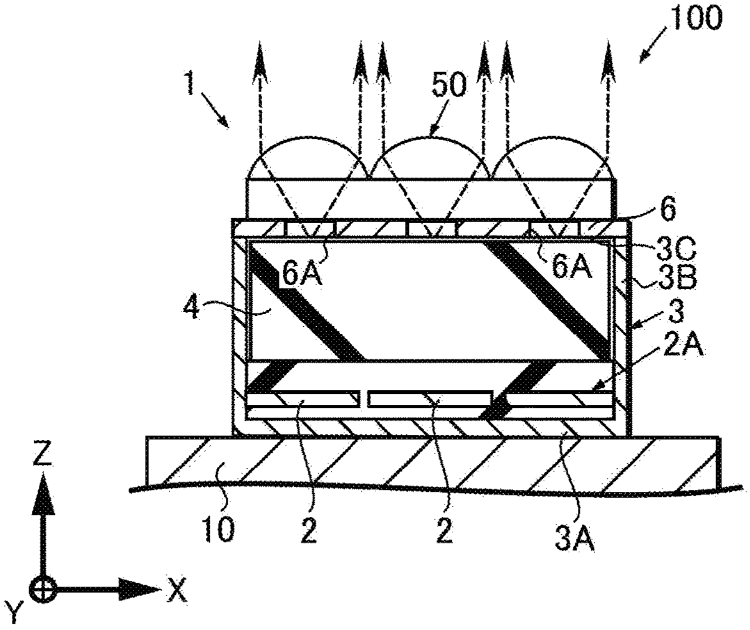

[ FIG. 19 ]
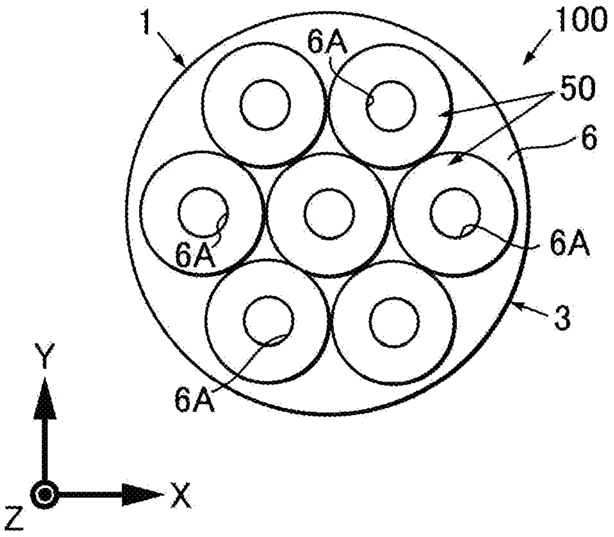
[ FIG. 20 ]
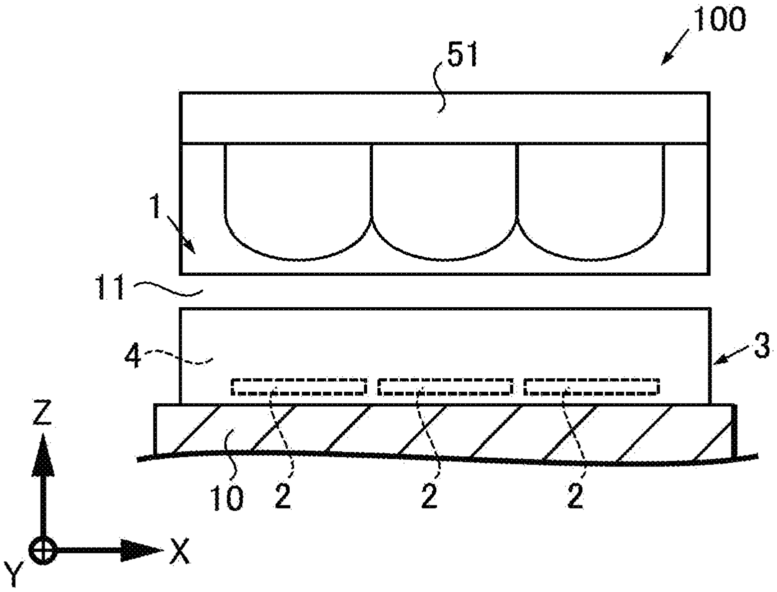

[ FIG. 21 ]
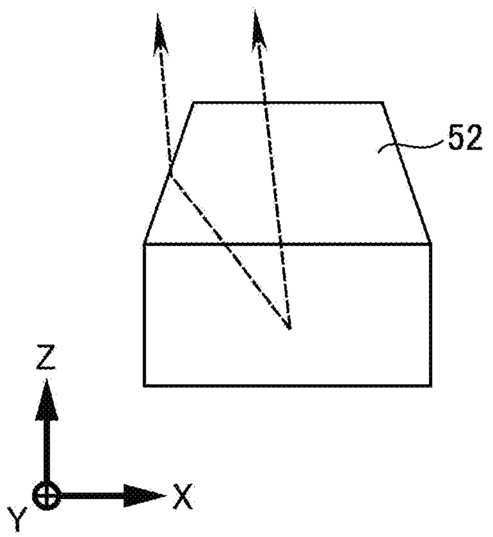

LIGHT-EMITTING DEVICE AND IMAGE DISPLAY DEVICE

CROSS REFERENCE TO RELATED APPLICATIONS

This application is a U.S. National Phase of International Patent Application No. PCT/JP2022/009155 filed on Mar. 3, 2022, which claims priority benefit of Japanese Patent Application No. JP 2021-125300 filed in the Japan Patent Office on Jul. 30, 2021. Each of the above-referenced applications is hereby incorporated herein by reference in its entirety.

TECHNICAL FIELD

The present disclosure relates to a light-emitting device and an image display device.

BACKGROUND ART

PTL1 listed below discloses a display element and a display device. In the display element, a plurality of micro light-emitting elements is arrayed on a driver circuit substrate. On a light exit side of the micro light-emitting element, a wavelength conversion section and a condenser section (lens) are provided in this order. The micro light-emitting elements constitute a pixel. The condenser section condenses light and display the pixel. The display device includes the above-described display element. The display element and display device configured as described above have come to attention as next-generation compact display with high luminance. For example, such display element and display device are expected to be applicable to a head-mounted display (HMD) such as augmented reality (AR) glasses or virtual reality goggles.

CITATION LIST

Patent Literature

PTL 1: Japanese Unexamined Patent Application Publication No. 2019-152851

SUMMARY OF THE INVENTION

The display element and the display device disclosed in PTL 1 use a self-luminous device as the micro light-emitting element. The self-luminous device serves as a surface light source that scatters light isotropically. In addition, the light-emitting element is configured in such a manner that a diameter of a light exit surface of the wavelength conversion section is substantially identical to a diameter of a condenser section. This makes it difficult for the condenser section to sufficiently collect light into a light exit direction. However, to increase luminance in the light exit direction, it is necessary to expand pixel pitch, reduce a light exit area of the wavelength conversion section, or increase the diameter of the condenser section.

Therefore, with regard to the light-emitting device and the image display device, it has been desired to satisfy both of improvement in luminance in the light exit direction and reduction in the pixel pitch.

A light-emitting device according to a first embodiment of the present disclosure includes: a light-emitting element having a light-emitting surface; a light-reflective section that reflects light emitted from the light-emitting surface, the light-reflective section being provided on an opposite side from the light-emitting surface of the light-emitting element and a side-surface side of the light-emitting element; a lens that collects the light emitted from the light-emitting surface, the lens being provided on the light-emitting-surface side; and a light-shielding section that blocks the light emitted from the light-emitting surface, the light-shielding section being provided between the light-emitting surface and the lens and having an opening to admit light, the opening penetrating the light-shielding section in a thickness direction.

An image display device according to a second embodiment of the present disclosure includes a plurality of arrays of light-emitting devices. The light-emitting device includes a light-emitting element having a light-emitting surface; a light-reflective section that reflects light emitted from the light-emitting surface, the light-reflective section being provided on an opposite side from the light-emitting surface of the light-emitting element and a side-surface side of the light-emitting element; a lens that collects the light emitted from the light-emitting surface, the lens being provided on the light-emitting-surface side; and a light-shielding section that blocks the light emitted from the light-emitting surface, the light-shielding section being provided between the light-emitting surface and the lens and having an opening to admit light, the opening penetrating the light-shielding section in a thickness direction.

BRIEF DESCRIPTION OF THE DRAWINGS

FIG. 1 is a cross-sectional view of major parts of a light-emitting device and an image display device according to a first embodiment of the present disclosure.

FIG. 2 is a plan view of major parts of the light-emitting device and the image display device illustrated in FIG. 1.

FIG. 3 is a model diagram for describing a detailed structure of the light-emitting device illustrated in FIG. 1 and FIG. 2.

FIG. 4 is a graph illustrating a relation between opening size and light capture angle of an opening of the light-emitting device illustrated in FIG. 3.

FIG. 5A is a cross-sectional view of a major part of the light-emitting device according to a first embodiment, the major part serving as a luminance measurement target.

FIG. 5B is a cross-sectional view of a major part of a light-emitting device according to a first comparative example, the major part serving as a luminance measurement target.

FIG. 5C is a cross-sectional view of a major part of a light-emitting device according to a second comparative example, the major part serving as a luminance measurement target.

FIG. 6 is a graph illustrating results of luminance measurement related to the light-emitting device according to the first embodiment, the light-emitting device according to the first comparative example, and the light-emitting device according to the second comparative example.

FIG. 7 is a cross-sectional view related to a first process corresponding to FIG. 1 for describing a method of manufacturing the light-emitting device and the image display device according to the first embodiment.

FIG. 8 is a cross-sectional view related to a second process.

FIG. 9 is a cross-sectional view related to a process corresponding to FIG. 1 for describing a method of manufacturing a light-emitting device and an image display device according to a second embodiment of the present disclosure.

FIG. 10 is a cross-sectional view of a major part of a light-emitting device according to a third embodiment of the present disclosure, the major part corresponding to FIG. 1.

FIG. 11 is a cross-sectional view of a major part of a light-emitting device according to a fourth embodiment of the present disclosure, the major part corresponding to FIG. 1.

FIG. 12 is a cross-sectional view of a major part of a light-emitting device according to a fifth embodiment of the present disclosure, the major part corresponding to FIG. 1.

FIG. 13 is a cross-sectional view of a major part of a light-emitting device according to a sixth embodiment of the present disclosure, the major part corresponding to FIG. 1.

FIG. 14 is a cross-sectional view of a major part of a light-emitting device according to a seventh embodiment of the present disclosure, the major part corresponding to FIG. 1.

FIG. 15 is a cross-sectional view of a major part of a light-emitting device according to an eighth embodiment of the present disclosure, the major part corresponding to FIG. 1.

FIG. 16A is a plan view of a major part of a light-emitting device according to a ninth embodiment of the present disclosure, the major part corresponding to FIG. 2.

FIG. 16B is a plan view of a major part of a light-emitting device according to a first modification of the ninth embodiment, the major part corresponding to FIG. 16A.

FIG. 16C is a plan view of a major part of a light-emitting device according to a second modification of the ninth embodiment, the major part corresponding to FIG. 16A.

FIG. 16D is a plan view of a major part of a light-emitting device according to a third modification of the ninth embodiment, the major part corresponding to FIG. 16A.

FIG. 17 is a cross-sectional view of major parts of a light-emitting device and an image display device according to a tenth embodiment of the present disclosure, the major part corresponding to FIG. 1.

FIG. 18 is a cross-sectional view of major parts of a light-emitting device and an image display device according to an eleventh embodiment of the present disclosure, the major part corresponding to FIG. 1.

FIG. 19 is a plan view of major parts of the light-emitting device and the image display device according to the eleventh embodiment, the major part corresponding to FIG. 2.

FIG. 20 is a cross-sectional view of major parts of a light-emitting device and an image display device according to a twelfth embodiment of the present disclosure, the major part corresponding to FIG. 1.

FIG. 21 is a schematic cross-sectional view of a major part of a light-emitting device according to a thirteenth embodiment of the present disclosure.

MODES FOR CARRYING OUT THE INVENTION

Hereinafter, with reference to drawings, details of embodiments of the present disclosure will be described. It is to be noted that the description is given in the following order.

1. First Embodiment

In the first embodiment, an example of applying the present technology to a light-emitting device and an image display device will be described. Here, basic structures and a manufacturing method of the light-emitting device and the image display device will be described.

2. Second Embodiment

In the second embodiment, a modification of the manufacturing method of the light-emitting device and the image display device according to the first embodiment will be described.

3. Third Embodiment

In the third embodiment, a first modification of a light-reflective section of the light-emitting device and the image display device according to the first embodiment will be described.

4. Fourth Embodiment

In the fourth embodiment, a second modification of the light-reflective section of the light-emitting device and the image display device according to the first embodiment will be described.

5. Fifth Embodiment

In the fifth embodiment, a first modification of a light control section of the light-emitting device and the image display device according to the first embodiment will be described.

6. Sixth Embodiment

In the sixth embodiment, a first modification of a light-shielding section of the light-emitting device and the image display device according to the first embodiment will be described.

7. Seventh Embodiment

In the seventh embodiment, a second modification of the light-shielding section of the light-emitting device and the image display device according to the first embodiment will be described.

8. Eighth Embodiment

In the eighth embodiment, a second modification of the light control section of the light-emitting device and the image display device according to the first embodiment will be described.

9. Ninth Embodiment

In the ninth embodiment, a third modification of the light-shielding section of the light-emitting device and the image display device according to the first embodiment will be described. Here, a plurality of variations of the third modification will be described.

10. Tenth Embodiment

In the tenth embodiment, a third modification of the light control section of the light-emitting device and the image display device according to the first embodiment will be described.

11. Eleventh Embodiment

In the eleventh embodiment, a fourth modification of the light-shielding section of the light-emitting device and the image display device according to the first embodiment will be described.

12. Twelfth Embodiment

In the twelfth embodiment, a first modification of a lens of the light-emitting device and the image display device according to the first embodiment will be described.

13. Thirteenth Embodiment

In the thirteenth embodiment, a second modification of the lens of the light-emitting device and the image display device according to the first embodiment will be described. Here, a plurality of variations of the second modification will be described.

14. Other Embodiments

First Embodiment

A light-emitting device 1 and an image display device 100 according to the first embodiment of the present disclosure will be described with reference to FIG. 1 to FIG. 8.

Here, an X-arrow direction appropriately illustrated in the drawings indicates a planar direction of the light-emitting device 1 and the image display device 100 placed on a plane for descriptive purposes. AY-arrow direction indicates another planar direction orthogonal to the X-arrow direction. In addition, a Z-arrow direction indicates an upper direction orthogonal to the X-arrow direction and the Y-arrow direction. In other words, the X-arrow direction, Y-arrow direction, and Z-arrow direction are respectively identical to an X-axis direction, Y-axis direction, and Z-axis direction in a three-dimensional coordinate system. It is to be noted that the respective directions are provided for understanding of the present disclosure, and do not limit directions related to the present technology.

[Configurations of Light-Emitting Device 1 and Image Display Device 100]

(1) Schematic Overall Configurations of Light-Emitting Device 1 and Image Display Device 100

FIG. 1 illustrates an example of vertical cross-sectional configurations of the light-emitting device 1 and the image display device 100. FIG. 2 illustrates an example of planar configurations of the light-emitting device 1 and the image display device 100. It is to be noted that the cross-sectional configurations illustrated in FIG. 1 are taken along a line A-A of FIG. 2. In addition, portions of structural elements illustrated in FIG. 1, specifically, lenses 5 are omitted in FIG. 2.

The image display device 100 according to the first embodiment includes a plurality of arrays of the light-emitting devices 1. Here, the plurality of light-emitting devices 1 are arrayed in the X-arrow direction and the Y-arrow direction. In addition, array pitch of the light-emitting devices 1 arrayed in an array in the X-arrow direction is shifted by ½ from array pitch of the light-emitting devices 1 arrayed in another array in the X-arrow direction adjacent to the Y-arrow direction.

The light-emitting devices 1 are provided on a substrate 10. The light-emitting device 1 includes a light-emitting element 2, a light-reflective section 3, a light control section 4, a lens 5, and a light-shielding section 6 as major structural elements.

(2) Configuration of Substrate 10

The substrate 10 is a substrate shared by the plurality of arrays of light-emitting devices 1, and also serves as a substrate of the image display device 100. The substrate 10 is provided with a driver circuit (not illustrated) for driving the light-emitting devices 1. The substrate 10 includes a semiconductor substrate such as a silicon substrate, a glass substrate, or a glass epoxy substrate, for example.

(3) Configuration of Light-Emitting Element 2

A self-luminous light source is used for the light-emitting element 2. The light-emitting elements 2 have circular shapes when viewed from the Z-arrow direction (hereinafter, simply referred to as "plan view"), and have a layered shape when viewed from the Y-arrow direction (hereinafter, simply referred to as "side view"). A top surface of the light-emitting element 2 obtained when viewed from the Z-arrow direction (hereinafter, simply referred to as "upper direction") is a light-emitting surface 2A. The light-emitting element 2 isotropically emits light from the light-emitting surface 2A toward the upper direction. Here, a light-emitting diameter D (see FIG. 1 and FIG. 3) of the light-emitting surface 2A on a plane in the X-arrow direction or the Y-arrow direction (hereinafter, simply referred to as "plane") is a size of a diameter of a region that emits light effectively.

Here, the light-emitting element 2 includes a light emitting diode (LED), for example. The LED includes a III-V compound semiconductor (inorganic compound semiconductor). It is to be noted that, the light-emitting element 2 may be a laser (light amplification by stimulated emission of radiation) including a compound semiconductor in a similar way. Alternatively, the light-emitting element 2 may be an organic electroluminescence (organic EL) diode including an organic semiconductor.

(4) Configuration of Light-Reflective Section 3

The light-reflective section 3 includes at least a first light-reflective section 3A and a second light-reflective section 3B. The first light-reflective section 3A is provided in such a manner that the first light-reflective section 3A is opposed to a bottom surface on an opposite side from the light-emitting surface 2A of the light-emitting element 2, and the first light-reflective section 3A extends on the plane. The first light-reflective section 3A reflects light or the like emitted from the light-emitting surface 2A toward the upper direction. The second light-reflective section 3B is provided in such a manner that the second light-reflective section 3B surrounds the light-emitting element 2 on a side-surface side and stands on the first light-reflective section 3A beyond the light-emitting element 2. The second light-reflective section 3B reflects light or the like emitted from the light-emitting surface 2A toward the upper direction. Here, the second light-reflective section 3B according to the first embodiment is provided in such a manner that the second light-reflective section 3B is vertical to the first light-reflective section 3A. It is sufficient that the second light-reflective section 3B has a function of reflecting light toward the upper direction. Therefore, for example, the second light-reflective section 3B may have a part that is opposed to a planar direction, the part being an inclined surface that has a frustum shape (whose diameter is radially enlarged) enlarged toward the upper direction from the first light-reflective section 3A.

The light-reflective section 3 according to the first embodiment further includes a third light-reflective section 3C. The third light-reflective section 3C is provided on a light-emitting-surface 2A side of the light-shielding section 6 opposed to the light-emitting surface 2A of the light-emitting element 2. The third light-reflective section 3C is provided as a flat surface. The third light-reflective section 3C reflects light or the like emitted from the light-emitting surface 2A toward the light-emitting surface 2A.

The first light-reflective section 3A, the second light-reflective section 3B, and the third light-reflective section 3C of the light-reflective section 3 may be connected with each other, or may be partially or wholly separated. In addition, for example, a portion of the second light-reflective section 3B may be separated. Specifically, a boundary between a portion of the second light-reflective section 3B and the light-emitting element 2 and a boundary between a portion of the second light-reflective section 3B and the light control section 4 may be separated.

Each of the first light-reflective section 3A, the second light-reflective section 3B, and the third light-reflective section 3C includes a metal body having an excellent light-reflective property, such as aluminum (Al). Alternatively, a base part of each of the first light-reflective section 3A, the second light-reflective section 3B, and the third light-reflective section 3C may include a resin body, and the metal body may be provided on a surface of the resin body, instead of forming the whole of each of the light-reflective sections by using the metal body. In addition, Ag, Au, Pt, Cu, Ti, or the like may be practically used as the metal body having the excellent light-reflective property.

(5) Configuration of Light Control Section 4

The light control section 4 is provided on a side of the light-emitting surface 2A of the light-emitting element 2 in a region surrounded by the first light-reflective section 3A, the second light-reflective section 3B, and the third light-reflective section 3C of the light-reflective section 3. The light control section 4 according to the first embodiment includes optical wavelength conversion material that controls (converts) wavelength of the light. In other words, the light control section 4 absorbs the light emitted from the light-emitting surface 2A and converts wavelength of the absorbed light. For example, the light control section 4 converts blue light emitted from the light-emitting surface 2A into green light, red light, or blue light. Here, "solid lines" in FIG. 1 indicate the light emitted from the light-emitting surface 2A of the light-emitting element 2. In addition, "dashed arrows" indicate light having wavelength controlled by the light control section 4, that is, fluorescence excitation light. Furthermore, "star-like symbols" indicating conversion of light into fluorescence excitation light are provided at connecting portions between the solid lines"and the dashed arrows" for descriptive purposes. As the optical wavelength conversion material, it is possible to use an inorganic phosphor, an organic phosphor, or quantum dots, for example.

(6) Configuration of Lens 5

The lens 5 is provided on an opposite side from the light-emitting element 2 across the light control section 4. The lens 5 has its center position that is identical to an optical axis Lc of the light emitted from the light-emitting surface 2A. As the lens 5, an optical spherical lens that is convex upward is used. The lens 5 includes a silicon dioxide film ($SiO_2$), for example. The lens 5 collects light that is emitted from the light-emitting surface 2A and whose wavelength is controlled by the light control section 4. It is to be noted that the lens 5 may include inorganic material such as a silicon nitride film (SiN), organic material such as transparent resin, or the like.

A lens diameter Ld of the lens 5 having a radius of curvature R on a plane is greater than or equal to the light-emitting diameter D of the light-emitting element 2 (see FIG. 3). For example, the lens diameter Ld of the lens 5 may be greater than the light-emitting diameter D by a thickness of the opposing second light-reflective section 3B of the light-reflective section 3 in a planar direction. Such a configuration allows the image display device 100 to have array pitch in such a manner that array pitch of the light-emitting devices 1 is identical to array pitch of the lenses 5.

(7) Configuration of Light-Shielding Section 6

The light-shielding section 6 has a plate-like shape and is provided between the light control section 4 and the lens 5. The light-shielding section 6 has an opening 6A to admit light whose wavelength is controlled by the light control section 4, the opening penetrating the light-shielding section 6 in a thickness direction.

Except for the opening 6A, the light-shielding section 6 covers a whole upper surface of the light control section 4 in a planar direction, and blocks light traveling from the light control section 4 toward the lens 5. As described above, the third light-reflective section 3C is provided on a side of the light-shielding section 6, the side being opposed to the light-emitting element 2. Therefore, light traveling toward the light-shielding section 6 is reflected by the third light-reflective section 3C toward the light-emitting surface 2A. The light-shielding section 6 is provided with the third light-reflective section 3C. Therefore, the light-shielding section 6 includes Al. Alternatively, the light-shielding section 6 may include a resin body that does not transmit light, for example, a resin body including black ink. Alternatively, for example, the light-shielding section 6 may have a base including a metal body with a lower reflectance than Al, and a metal body with a high reflectance may be provided on the metal body with the lower reflectance.

The opening 6A is provided for each of the light-emitting elements 2. In the first embodiment, the opening 6A has a circular shape like the shape of the light-emitting surface 2A in plan view. The opening 6A has an opening size A that is smaller than the lens diameter Ld or the light-emitting diameter D (see FIG. 3). The opening size A is constant in the thickness direction of the light-shielding section 6. This means that the opening 6A has an opening edge provided on a vertical plane. In addition, the opening size A is greater or equal to alight collection diameter (spot diameter) Ls of the lens 5 irradiated with light from the upper direction. For example, the opening size A may be greater than 10 nm. The opening 6A has its center position that is identical to the optical axis Lc. The opening 6A admits light that is emitted from the light-emitting surface 2A and controlled by the light control section 4. In addition, the opening 6A admits light that is emitted from the light-emitting surface 2A, reflected by the light-reflective section 3, and controlled by the light control section 4.

(8) Relation between Opening Size A and Light Capture Angle θ

FIG. 3 is a model for describing details of the vertical cross-sectional configuration of the light-emitting device 1. The radius of curvature R of the lens 5 is desirably set to a half of the light-emitting diameter D of the light-emitting element 2 ($R=D/2$) on a basis of a light capture angle θ to be used when the light-emitting device 1 emits light toward a projection surface 7 of an optical system. The light capture angle θ is an angle between the output light and a perpendicular line to the projection surface 7. In addition, the lens diameter Ld is set to a same size as the light-emitting diameter D ($Ls=D$). In FIG. 3, a diameter of an end surface of the light control section 4 on a side of the lens 5 is illustrated as the light-emitting diameter D for descriptive purposes. Such a configuration makes it possible to improve an efficiency of collecting light emitted from the light-emitting device 1 toward the projection surface 7, and this allows the light-emitting device 1 to have a low-profile structure in which the light-emitting device 1 has a low height in the Z-arrow direction. In addition, a light-emitting position is set to a part on a surface of the light control section 4 into which the light with the light capture angle θ is collected through the lens 5 (portion on which the light collection diameter Ls is obtained). A distance between the light-emitting position and an apex of the lens 5 is referred to as a height T.

FIG. 4 illustrates a relation between the light capture angle θ and magnification. A horizontal axis represents the light capture angle θ, and a vertical axis represents the magnification. The magnification is represented by the following expression.

$$\text{Opening Size } A = \text{Magnification} \times \text{Light-Emitting Diameter } D$$

Data D1 illustrated in FIG. 4 represents "R=D/2". As described above, "R" represents a radius of curvature of the lens 5. "D" represents a light-emitting diameter of the light-emitting surface 2A. Data D2 represents "R=D/2×1.2". Data D3 represents "R=D/2×1.6". As apparent from FIG. 4, the magnification tends to decrease as the radius of curvature R increases. In addition, the light capture angle θ tends to get smaller as the magnification decreases. Moreover, the light capture angle θ also tends to get smaller as the opening size A of the opening 6A of the light-shielding section 6 gets smaller.

(9) About Luminance of Light-Emitting Device 1

FIG. 5A illustrates a vertical cross-sectional configuration of the light-emitting device 1 according to the first embodiment. FIG. 5B illustrates a vertical cross-sectional configuration of a light-emitting device 1A according to a first comparative example. The light-emitting device 1A does not include the light-shielding section 6 (or the third light-reflective section 3C), the opening 6A, or the lens 5 of the light-emitting device 1. FIG. 5C illustrates a vertical cross-sectional configuration of a light-emitting device 1B according to a second comparative example. The light-emitting device 1B includes the lens 5 of the light-emitting device 1, but does not include the light-shielding section 6 (or the third light-reflective section 3C) or the opening 6A.

FIG. 6 illustrates respective luminance of the light-emitting device 1 according to the first embodiment, the light-emitting device 1A according to the first comparative example, and the light-emitting device 1B according to the second comparative example. A vertical axis represents the luminance. Ray tracing is used for measuring the luminance.

FIG. 6 illustrates measurement results obtained when the light capture angle θ is set to about ±10°. Data D5 represents luminance of the light-emitting device 1A according to the first comparative example. Here, the luminance of the light-emitting device 1A is set to a reference value that is "100%". Data D6 represents luminance of the light-emitting device 1B according to the second comparative example. Although the light-emitting device 1B includes the lens 5, the luminance of the light-emitting device 1B is hardly changed from the luminance of the light-emitting device 1A. Data D4 represents luminance of the light-emitting device 1 according to the first embodiment. The luminance of the light-emitting device 1 is drastically increased from the luminance of the light-emitting device 1A and the luminance of the light-emitting device 1B. The increase in luminance of the light-emitting device 1 reaches about 50%.

[Method of Manufacturing Light-Emitting Device 1 and Image Display Device 100]

Next, a method of manufacturing the light-emitting device 1 and the image display device 100 will be briefly described. FIG. 7 and FIG. 8 illustrate cross-sectional views related to processes for describing a method of manufacturing the light-emitting device 1 and the image display device 100 according to the first embodiment.

First, the light-reflective section 3 including the first light-reflective section 3A and the second light-reflective section 3B is formed (see FIG. 7). The light-emitting element 2 and the light control section 4 are sequentially formed in the light-reflective section 3 (see FIG. 7). Next, the light-shielding section 6 is formed above the light control section 4, and the opening 6A is made in the light-shielding section 6 (See FIG. 7). A lens-forming layer 5A is formed above the light-shielding section 6 having the opening 6A (see FIG. 7). The lens-forming layer 5A includes $SiO_2$, for example. As illustrated in FIG. 7, a surface part of the lens-forming layer 5A is removed from a region between the light-emitting devices 1. Such removal forms a groove 5B on the surface part of the lens-forming layer 5A. A photolithography technology and an etching technology are used for the removal.

As illustrated in FIG. 8, a reflow process is performed on the lens-forming layer 5A to form the lenses 5 having a spherical shape from the lens-forming layer 5A. After the series of manufacturing processes end, it is possible to obtain the light-emitting device 1 and the image display device 100 including a plurality of arrays of the light-emitting devices 1.

According to the method of manufacturing the light-emitting device 1 and the image display device 100 according to the first embodiment, it is possible to manufacture a large number of the lenses 5 at a time. This makes it possible to reduce manufacturing costs.

[Working Effects]

As illustrated in FIG. 1 and FIG. 2, the light-emitting device 1 according to the first embodiment includes the light-emitting element 2, the light-reflective section 3, the light control section 4, the lens 5, and the light-shielding section 6. The light-emitting element 2 has the light-emitting surface 2A. The light-reflective section 3 reflects light emitted from the light-emitting surface 2A, the light-reflective section 3 being provided on an opposite side from the light-emitting surface 2A of the light-emitting element 2 and a side-surface side of the light-emitting element 2. The light control section 4 controls wavelength of the light, the light control section 4 being provided on a side of the light-emitting surface 2A in a region surrounded by the light-reflective section 3. The lens 5 collects the light emitted from the light-emitting surface 2A, the lens 5 being provided on an opposite side from the light-emitting element 2 across the light control section 4. Next, the light-shielding section 6 blocks the light emitted from the light-emitting surface 2A, the light-shielding section 6 being provided between the light control section 4 and the lens 5 and having the opening 6A to admit light, the opening 6A penetrating the light-shielding section 6 in the thickness direction. In the light-emitting device 1, the light emitted from the light-emitting surface 2A of the light-emitting element 2 passes through the light control section 4, exits through the opening 6A, further gets reflected by the light-reflective section 3, passes through the light control section 4, and exits through the opening 6A. This makes it possible to improve luminance in a light exit direction as illustrated in FIG. 6. In addition, since the light-emitting device 1 makes it possible to improve luminance in the light exit direction, the light-emitting diameter D of the light-emitting surface 2A of the light-emitting element 2 (size of the end surface of the light control section 4) may be similar to the lens diameter Ld of the lens 5. This makes it possible to narrow pitch between the light-emitting devices 1. Therefore, when using the light-emitting device 1 and the image display device 100 including the light-emitting devices 1, it becomes possible to satisfy both of improvement in luminance in the light exit direction and reduction in the pixel pitch.

In addition, since the light-emitting device 1 makes it possible to improve luminance, it becomes possible to operate while saving electric power. In addition, as illustrated in FIG. 1, the light-emitting device 1 includes the light control section 4. This makes it possible to also trap the fluorescence excitation light in the light control section 4 to control the wavelength of the light, and it becomes possible to suppress color mixing related to final output light. In addition, since the light control section 4 is surrounded by the light-reflective section 3 in the light-emitting device 1, it is possible to lengthen an effective optical path length by reflection. This makes it possible to obtain the low-profile light control section 4 with regard to the light-emitting device 1 and the image display device 100.

In addition, as illustrated in FIG. 1 and FIG. 3, the opening 6A of the light-emitting device 1 has the opening size A that is smaller than the lens diameter Ld of the lens 5 or the light-emitting diameter D of the light-emitting surface 2A and larger than the light collection diameter Ls of the lens 5 obtained at the light-emitting position. This makes it possible to narrow the light capture angle θ as illustrated in FIG. 4.

In addition, as illustrated in FIG. 1 and FIG. 3, the light-emitting diameter D of the light-emitting surface 2A of the light-emitting device 1 is smaller than or equal to the lens diameter Ld of the lens 5. This makes it possible to achieve the array pitch in such a manner that the array pitch of the lenses 5 is identical or approximate to the array pitch of the light-emitting elements 2, and it is possible to narrow the pitch between the light-emitting devices 1.

In addition, as illustrated in FIG. 1, the light-reflective section 3 of the light-emitting device 1 includes the third light-reflective section 3C that reflects light. The third light-reflective section 3C is provided on a light-emitting-surface 2A side of the light-shielding section 6. Therefore, light that gets reflected by the third light-reflective section 3C, passes through the light control section 4, and exits through the opening 6A is added in the light-emitting device 1. This makes it possible to further improve luminance in the light exit direction.

In addition, working effect achieved by the above-described light-emitting device 1 is similar to working effect related to the image display device 100.

2. Second Embodiment

Next, a light-emitting device 1 and an image display device 100 according to the second embodiment of the present disclosure will be described. It is to be noted that, in the second and subsequent embodiments, structural elements that have substantially the same function and structure as the structural elements of the light-emitting device 1 and the image display device 100 according to the first embodiment are denoted with the same reference signs, and repeated explanation thereof is omitted.

[Method of Manufacturing Light-Emitting Device 1 and Image Display Device 100]

In the second embodiment, a modification of the method of manufacturing the light-emitting device 1 and the image display device 100 according to the first embodiment will be described. FIG. 9 illustrates a cross-sectional view related to a process for describing a method of manufacturing a light-emitting device 1 and an image display device 1 according to the second embodiment.

As illustrated in FIG. 9, according to the method of manufacturing the light-emitting device 1 and the image display device 100, the light-shielding section 6 and the lenses 6 are bonded onto the light control section 4 and the second light-reflective section 3B of the light-reflective section 3 that are pre-manufactured. The lenses 5 are formed in advance on the light-shielding section 6 by using glass or resin. The light-shielding section 6 has the openings 6A. Adhesive 6B is used for the bonding.

According to the method of manufacturing the light-emitting device 1 and the image display device 100 according to the second embodiment, it is possible to independently perform manufacturing up to the light control section 4 of the light-emitting device 1 and manufacturing of the light-shielding section 6 and the lenses 5 under optimal conditions. This makes it possible to improve manufacturing yield.

Modification

It is to be noted that, according to the method of manufacturing the light-emitting device 1 and the image display device 100 according to the second embodiment, it is possible to manufacture the lenses 5 through imprint lithography for printing a lens shape of a mold on the lens-forming layer such as glass or resin. In this case, it is possible to bond the lenses 5 after manufacturing the lenses 5 in a way similar to the method of manufacturing the light-emitting device 1 and the image display device 100 according to the second embodiment.

3. Third Embodiment

Next, a light-emitting device 1 and an image display device 100 according to the third embodiment of the present disclosure will be described. FIG. 10 illustrates a vertical cross-sectional configuration of the light-emitting device 1 according to the third embodiment. It is to be noted that, the third to ninth embodiments will describes a single light-emitting element 1 alone, and description about an image display device 100 will be omitted.

[Configuration of Light-Emitting Device 1]

The light-emitting device 1 according to the third embodiment includes a third light-reflective section 3D instead of the third light-reflective section 3C of the light-emitting device 1 according to the first embodiment. The third light-reflective section 3D is provided on a light-emitting-element 2 side of the light-shielding section 6 in a way similar to the third light-reflective section 3C. The third light-reflective section 3D is provided as a scattering surface.

Structural elements other than the above-described structural elements are same as the structural elements of the light-emitting device 1 according to the first embodiment.

[Working Effects]

The light-reflective section 3 of the light-emitting device 1 according to the third embodiment includes the third light-reflective section 3D. This makes it possible to scatter light that does not travel toward the opening 6A, and it is possible to effectively collect the light into the opening 6A. This makes it possible to further improve luminance in the light exit direction.

In addition, the third light-reflective section 3D expects optical effects that are similar to a case where the light control section 4 includes a light-scattering body. Therefore, this makes it possible to lengthen an effective optical path length in the light control section 4. Accordingly, this makes it possible to obtain the low-profile light control section 4. In addition, it is also possible to suppress color mixing. In addition, it is possible to reduce an amount of the light-scattering body included in the light control section 4 in a case where the light control section 4 includes the light-scattering body. This makes it possible to suppress optical characteristic variation in the light control section 4, and it is possible to improve optical reliability.

4. Fourth Embodiment

Next, a light-emitting device 1 according to the fourth embodiment of the present disclosure will be described.

[Configuration of Light-Emitting Device 1]

FIG. 11 illustrates a vertical cross-sectional configuration of the light-emitting device 1 according to the fourth embodiment. The light-reflective section 3 of the light-emitting device 1 according to the fourth embodiment includes a third light-reflective section 3E instead of the third light-reflective section 3C of the light-emitting device 1 according to the first embodiment. The third light-reflective section 3E is provided on a light-emitting-element 2 side of the light-shielding section 6 in a way similar to the third light-reflective section 3C. The third light-reflective section 3E is provided as a curved surface that is concave toward the lens 5.

Structural elements other than the above-described structural elements are same as the structural elements of the light-emitting device 1 according to the first embodiment.

[Working Effects]

The light-emitting device 1 according to the fourth embodiment is able to achieve working effects that are similar to the working effects achieved by the light-emitting device 1 according to the third embodiment. In addition, the light-emitting device 1 according to the fourth embodiment includes the third light-reflective section 3E. This makes it possible for the third light-reflective section 3E to reflect light that does not travel toward the opening 6A, and it is possible to effectively collect the light into the opening 6A. This makes it possible to further improve luminance in the light exit direction.

5. Fifth Embodiment

Next, a light-emitting device 1 according to the fifth embodiment of the present disclosure will be described.

[Configuration of Light-Emitting Device 1]

FIG. 12 illustrates a vertical cross-sectional configuration of the light-emitting device 1 according to the fifth embodiment. The light-emitting device 1 according to the fifth embodiment includes a second lens 8 between the light control section 4 and the light-emitting surface 2A of the light-emitting element 2. The second lens 8 has a curved surface that is concave toward the light-emitting surface 2A, and collects light emitted from the light-emitting surface 2A. It is possible to form the second lens 8 by using material similar to the lens 5, for example.

Structural elements other than the above-described structural elements are same as the structural elements of the light-emitting device 1 according to the first embodiment.

[Working Effects]

The light-emitting device 1 according to the fifth embodiment is able to achieve working effects that are similar to the working effects achieved by the light-emitting device 1 according to the third embodiment. In addition, since the light-emitting device 1 according to the fifth embodiment includes the second lens 8, it is possible to effectively collect light emitted from the light-emitting surface 2A, into the opening 6A. This makes it possible to further improve luminance in the light exit direction.

6. Sixth Embodiment

Next, a light-emitting device 1 according to the sixth embodiment of the present disclosure will be described.

[Configuration of Light-Emitting Device 1]

FIG. 13 illustrates a vertical cross-sectional configuration of the light-emitting device 1 according to the sixth embodiment. The light-shielding section 6 of the light-emitting device 1 according to the sixth embodiment has an opening 6C instead of the opening 6A of the light-emitting device 1 according to the first embodiment. The opening 6C has an inclined surface with an opening size A radially enlarged toward the lens 5 from the light control section 4. This means that the opening 6C has an opening edge provided on the inclined surface. The inclined surface of the opening 6C is provided with a fourth light-reflective section 3F. In a case where the light-shielding section 6 includes a metal body with a high reflectance, the inclined surface of the opening 6C may serve as the forth light-reflective section 3F. In a case where the light-shielding section 6 includes a metal body with a low reflectance, the forth light-reflective section 3F with a high reflectance is separately provided on the inclined surface of the opening 6C.

Structural elements other than the above-described structural elements are same as the structural elements of the light-emitting device 1 according to the first embodiment.

[Working Effects]

The light-emitting device 1 according to the sixth embodiment is able to achieve working effects that are similar to the working effects achieved by the light-emitting device 1 according to the first embodiment. In addition, the light-emitting device 1 according to the sixth embodiment has the opening 6C radially enlarged toward the lens 5. In addition, the opening 6C is provided with the fourth light-reflective section 3F. This makes it possible for the fourth light-reflective section 3F provided on the opening 6C to collect high-angle light into a front in the light exit direction. Therefore, it is possible to further improve luminance at the front.

7. Seventh Embodiment

Next, a light-emitting device 1 according to the seventh embodiment of the present disclosure will be described.

[Configuration of Light-Emitting Device 1]

FIG. 14 illustrates a vertical cross-sectional configuration of the light-emitting device 1 according to the seventh embodiment. The light-emitting device 1 according to the seventh embodiment includes a wavelength cutoff filter 9A between the light-shielding section 6 and the lens 5 of the light-emitting device 1 according to the first embodiment. It is to be noted that the wavelength cutoff filter 9A may be provided under the light-shielding section 6.

The wavelength cutoff filter 9A is formed as a longpass edge filter. Although a detailed configuration thereof is not illustrated, the wavelength cutoff filter 9A includes multiple layers (for example, (0.5 L, 1H, 0.5 L)×10 layers) in which high refractive material (such as $TiO_2$) and low refractive material (such as $SiO_2$) are stacked, for example. The wavelength cutoff filter 9A is able to reflect only excitation light whose wavelength is not controlled in the light control section 4.

Structural elements other than the above-described structural elements are same as the structural elements of the light-emitting device 1 according to the first embodiment.

[Working Effects]

The light-emitting device 1 according to the seventh embodiment is able to achieve working effects that are similar to the working effects achieved by the light-emitting device 1 according to the first embodiment.

In addition, since the light-emitting device 1 according to the seventh embodiment includes the wavelength cutoff filter 9A, it is possible to reflect only excitation light whose wavelength is not controlled in the light control section 4 and to suppress color mixing. Furthermore, it is possible for the light control section 4 to lengthen the effective optical path, and this makes it possible to obtain the low-profile light control section 4.

8. Eighth Embodiment

Next, a light-emitting device 1 according to the eighth embodiment of the present disclosure will be described.

[Configuration of Light-Emitting Device 1]

FIG. 15 illustrates a vertical cross-sectional configuration of the light-emitting device 1 according to the eighth embodiment. The light-emitting device 1 according to the eighth embodiment includes a wavelength cutoff filter 9B between the light-emitting element 2 and the light control section 4 of the light-emitting device 1 according to the first embodiment.

The wavelength cutoff filter 9B is formed as a shortpass edge filter. The wavelength cutoff filter 9B is configured in a way similar to the wavelength cutoff filter 9A of the light-emitting device 1 according to the seventh embodiment. The wavelength cutoff filter 9B is able to reflect only fluorescence excitation light in the light control section 4.

Structural elements other than the above-described structural elements are same as the structural elements of the light-emitting device 1 according to the first embodiment.

[Working Effects]

The light-emitting device 1 according to the eighth embodiment is able to achieve working effects that are similar to the working effects achieved by the light-emitting device 1 according to the first embodiment.

In addition, since the light-emitting device 1 according to the eighth embodiment includes the wavelength cutoff filter 9B, it is possible to reflect only fluorescence excitation light in the light control section 4 and to lengthen an optical path in the light control section 4. Accordingly, this makes it possible to obtain the low-profile light control section 4.

9. Ninth Embodiment

Next, a light-emitting device 1 according to the ninth embodiment of the present disclosure will be described.

[Configuration of Light-Emitting Device 1]

FIG. 16A illustrates a planar configuration of the light-emitting device 1 according to the ninth embodiment. The light-shielding section 6 of the light-emitting device 1 according to the ninth embodiment has an opening 6D. The opening 6D has an oval shape in plan view, the oval shape having a long axis in the X-arrow direction. This means that the opening 6D is made in such a manner that a light exit range is expanded in the X-arrow direction, and is narrowed in the Y-arrow direction. On the projection surface 7 (see FIG. 3), output light has an oval shape.

Structural elements other than the above-described structural elements are same as the structural elements of the light-emitting device 1 according to the first embodiment.

[Working Effects]

The light-emitting device 1 according to the ninth embodiment is able to achieve working effects that are similar to the working effects achieved by the light-emitting device 1 according to the first embodiment.

In addition, since the light-emitting device 1 has the oval opening 6D, it is possible to expand the light exit range in the X-arrow direction and improve luminance. On the other hand, it is possible to narrow the light exit range in the Y-arrow direction and limit the light exit range. This makes it possible to easily achieve a display method of limiting a viewing angle in a certain direction, such as a function comparable to a privacy screen protector or the like by modifying the shape of the opening 6D.

First Modification

FIG. 16B illustrates a planar configuration of a light-emitting device 1 according to a first modification of the ninth embodiment. The light-shielding section 6 of the light-emitting device 1 according to the first modification has an opening 6E. The opening 6E has a square shape in plan view, the square shape having equal sides in the X-arrow direction and the Y-arrow direction. On the projection surface 7 (see FIG. 3), output light has a square shape. For example, a cylindrical lens may be preferably provided as the lens 5 in combination, in a case of improving luminance of light to be output in a specific range and limit light to be output in another specific range in a way similar to the light-emitting device 1 according to the ninth embodiment.

Structural elements other than the above-described structural elements are same as the structural elements of the light-emitting device 1 according to the first embodiment.

The light-emitting device 1 according to the first modification is able to achieve working effects that are similar to the working effects achieved by the light-emitting device 1 according to the ninth embodiment.

Second Modification

FIG. 16C illustrates a planar configuration of a light-emitting device 1 according to a second modification of the ninth embodiment. The light-shielding section 6 of the light-emitting device 1 according to the second modification has an opening 6F. The opening 6F has a rectangular shape in plan view, the rectangular shape having long sides in the X-arrow direction and short sides in the Y-arrow direction. On the projection surface 7 (see FIG. 3), output light has a rectangular shape.

Structural elements other than the above-described structural elements are same as the structural elements of the light-emitting device 1 according to the first embodiment.

The light-emitting device 1 according to the second modification is able to achieve working effects that are similar to the working effects achieved by the light-emitting device 1 according to the ninth embodiment.

Third Modification

FIG. 16D illustrates a planar configuration of a light-emitting device 1 according to a third modification of the ninth embodiment. The light-shielding section 6 of the light-emitting device 1 according to the third modification has an opening 6G. The opening 6G has a polygonal shape in plan view. Here, the opening 6G has a regular hexagonal shape. On the projection surface 7 (see FIG. 3), output light has a polygonal shape. Here, the polygonal shape includes triangular, pentagonal, heptagonal, and higher polygonal shapes. Such a polygonal shape may have sides of same length, or may have sides of different length. In addition, it is also possible to combine a cylindrical lens into the light-emitting device 1 according to the third modification in a way similar to the light-emitting device 1 according to the first modification.

Structural elements other than the above-described structural elements are same as the structural elements of the light-emitting device 1 according to the first embodiment.

The light-emitting device 1 according to the third modification is able to achieve working effects that are similar to the working effects achieved by the light-emitting device 1 according to the ninth embodiment.

10. Tenth Embodiment

Next, a light-emitting device 1 and an image display device 100 according to the tenth embodiment of the present disclosure will be described.

[Configuration of Light-Emitting Device 1]

FIG. 17 illustrates a vertical cross-sectional configuration of the light-emitting device 1 and the image display device 100 according to the tenth embodiment. The light-emitting device 1 according to the tenth embodiment includes a light control section 40 instead of the light control section 4 of the light-emitting device 1 according to the first embodiment. The light control section 40 includes a light-scattering body that control scattering of light. The light-scattering body includes color conversion material. Specifically, red color conversion material, green color conversion material, and blue color conversion material are used.

Structural elements other than the above-described structural elements are same as the structural elements of the light-emitting device 1 according to the first embodiment.

[Working Effects]

The light-emitting device 1 according to the tenth embodiment is able to achieve working effects that are similar to the working effects achieved by the light-emitting device 1 according to the first embodiment.

11. Eleventh Embodiment

Next, a light-emitting device 1 and an image display device 100 according to the eleventh embodiment of the present disclosure will be described.

[Configuration of Light-Emitting Device 1]

FIG. 18 illustrates a vertical cross-sectional configuration of the light-emitting device 1 and the image display device 100 according to the eleventh embodiment. FIG. 19 illustrates planar configurations of the light-emitting device 1 and the image display device 100 illustrated in FIG. 18.

In the light-emitting device 1 according to the eleventh embodiment, the light control section 4 is provided in the single light-reflective section 3 including the first light-reflective section 3A and the second light-reflective section 3B, and the light-shielding section 6 has a plurality of the openings 6A. The light-emitting element 2 is provided for each of the openings 6A. In the eleventh embodiment, the single light-reflective section 3 has the six openings 6A, and the six light-emitting elements 2 are provided in the single light-reflective section 3, but this does not limit the number of structural elements. On the light-shielding section 6, a fine microlens array 50 is provided. The microlens array 50 includes lenses provided at respective positions corresponding to the openings 6A.

Structural elements other than the above-described structural elements are same as the structural elements of the light-emitting device 1 according to the first embodiment.

[Working Effects]

The light-emitting device 1 according to the eleventh embodiment is able to achieve a working effect of improvement in luminance in the light exit direction like the working effects achieved by the light-emitting device 1 according to the first embodiment.

12. Twelfth Embodiment

Next, a light-emitting device 1 and an image display device 100 according to the twelfth embodiment of the present disclosure will be described.

[Configuration of Light-Emitting Device 1]

FIG. 20 illustrates a vertical cross-sectional configuration of the light-emitting device 1 and the image display device 100 according to the twelfth embodiment.

The light-shielding section 6 of the light-emitting device 1 according to the twelfth embodiment includes an opposed lens 51 provided above the light-shielding section 6 with a gap 11 therebetween. The opposed lens 51 has a flat surface on a light exit side.

Structural elements other than the above-described structural elements are same as the structural elements of the light-emitting device 1 according to the first embodiment.

[Working Effects]

The light-emitting device 1 according to the twelfth embodiment is able to achieve working effects that are similar to the working effects achieved by the light-emitting device 1 according to the first embodiment. In addition, the light-emitting device 1 includes the opposed lens 51 having the flat surface on the light exit side. This makes it possible to achieve mechanistic benefits such as an advantage that it becomes possible to attach a filter or a film to the opposed lens 51.

13. Thirteenth Embodiment

Next, a light-emitting device 1 and an image display device 100 according to the thirteenth embodiment of the present disclosure will be described.

[Configuration of Light-Emitting Device 1]

FIG. 21 illustrates a vertical cross-sectional configuration of the light-emitting device 1 and the image display device 100 according to the thirteenth embodiment.

The lens 5 of the light-emitting device 1 according to the thirteenth embodiment has a trapezoidal shape or a trapezoidal shape approximated to a spherical shape in side view.

Structural elements other than the above-described structural elements are same as the structural elements of the light-emitting device 1 according to the first embodiment.

[Working Effects]

The light-emitting device 1 and the image display device 100 according to the thirteenth embodiment is able to achieve working effects that are similar to the working effects achieved by the light-emitting device 1 and the image display device 100 according to the first embodiment. In addition, since the light-emitting device 1 and the image display device 100 includes the trapezoidal lens 5, this makes it possible to reduce variation in shape during manufacturing than the spherical lens 5. Therefore, it is possible to uniform luminance of the all light-emitting devices 1 in the image display device 100.

Modification

The light-emitting device 1 according to the thirteenth embodiment may include a lens 5 with a Fresnel surface. In addition, the lens 5 may be a diffractive lens. Such lenses 5 makes it possible to improve light collection effects. In addition, it is also possible to lower the height of the lens 5.

14. Other Embodiments

The present technology is not limited to the above-described embodiments, but may be modified in various ways without departing from the scope of the present technology. For example, when using the present technology, it is possible to combine two or more of the light-emitting devices 1 and the image display devices 100 according to the above-described embodiments and modifications.

The light-emitting device according to the present disclosure includes the light-emitting element, the light-reflective section, the light control section, the lens, and the light-shielding section. The light-emitting element has the light-emitting surface. The light-reflective section reflects light emitted from the light-emitting surface, the light-reflective section being provided on an opposite side from the light-emitting surface of the light-emitting element and a side-surface side of the light-emitting element. The light control section controls wavelength of the light, the light control section being provided on a side of the light-emitting surface in a region surrounded by the light-reflective section. The lens collects the light emitted from the light-emitting surface, the lens being provided on an opposite side from the light-emitting element across the light control section. Next, the light-shielding section blocks the light emitted from the light-emitting surface, the light-shielding section being provided between the light control section and the lens and having the opening to admit light, the opening penetrating the light-shielding section in the thickness direction. In the light-emitting device, the light emitted from the light-emitting surface of the light-emitting element passes through the light control section, exits through the opening, further gets reflected by the light-reflective section, passes through the light control section, and exits through the opening. This makes it possible to improve luminance in the light exit direction. In addition, since the light-emitting device makes it possible to improve luminance in the light exit direction, the light-emitting diameter of the light-emitting surface of the light-emitting element may be similar to the lens diameter of the lens. This makes it possible to narrow pitch between the light-emitting devices. Therefore, when using the light-emitting device and the image display device including the light-emitting devices, it becomes possible to satisfy both of improvement in luminance in the light exit direction and reduction in the pixel pitch.

<Configuration According to Present Technology>

The present technology has the following configurations. According to the present technology having the following configurations, it is possible to provide the light-emitting device and the image display device that satisfy both of improvement in luminance in the light exit direction and reduction in the pixel pitch.

(1) A light-emitting device including:
- a light-emitting element having a light-emitting surface;
- a light-reflective section that reflects light emitted from the light-emitting surface, the light-reflective section being provided on an opposite side from the light-emitting surface of the light-emitting element and a side-surface side of the light-emitting element;
- a lens that collects the light emitted from the light-emitting surface, the lens being provided on the light-emitting-surface side; and
- a light-shielding section that blocks the light emitted from the light-emitting surface, the light-shielding section being provided between the light-emitting surface and the lens and having an opening to admit light, the opening penetrating the light-shielding section in a thickness direction.

(2) The light-emitting device according to (1), further including
- a light control section that controls at least one of wavelength, scattering, or direction of light, the light control section being provided on the light-emitting-surface side in a region surrounded by the light-reflective section.

(3) The light-emitting device according to (1) or (2), in which
- the opening has an opening size that is larger than 10 nm and smaller than the lens diameter and a light-emitting diameter of the light-emitting surface, and
- the light-emitting diameter is smaller than or equal to the lens diameter.

(4) The light-emitting device according to any one of (1) to (3), in which the light-reflective section includes
- a first light-reflective section provided on the opposite side from the light-emitting surface of the light-emitting element,
- a second light-reflective section provided on the side-surface side of the light-emitting element, and
- a third light-reflective section provided on the light-emitting-surface side of the light-shielding section, the third light-reflective section reflecting light.

(5) The light-emitting device according to (4), in which the third light-reflective section is provided as a flat surface, a scattering surface, or a curved surface.

(6) The light-emitting device according to any one of (1) to (5), further including
- a second lens that collects the light emitted from the light-emitting surface, the second lens being provided between the light-emitting surface and the light-shielding section.

(7) The light-emitting device according to any one of (1) to (6), in which the opening has an opening edge that is a surface perpendicular to the light-emitting surface or an inclined surface with the opening size radially enlarged toward the lens.

(8) The light-emitting device according to (7), in which the opening edge is provided with a fourth light-reflective section that reflects light.

(9) The light-emitting device according to any one of (1) to (8), including
- a wavelength cutoff filter provided between the light-shielding section and the lens.

(10) The light-emitting device according to any one of (2) to (9), including a wavelength cutoff filter provided between the light-emitting surface and the light control section.

(11) The light-emitting device according to any one of (2) to (10), in which the light control section includes optical wavelength conversion material.

(12) The light-emitting device according to any one of (2) to (10), in which the light control section includes a light-scattering body.

(13) The light-emitting device according to any one of (1) to (11), in which the opening has a circular shape, an oval shape, a square shape, a rectangular shape, a triangular shape, or a polygonal shape including pentagonal and higher polygonal shapes when viewed from the lens.

(14) The light-emitting device according to any one of (1) to (13), in which an optical axis of the light emitted from the light-emitting surface is identical to a center of the opening.

(15) The light-emitting device according to any one of (1) to (14), in which the light-shielding section has a plurality of the openings.

(16) The light-emitting device according to any one of (1) to (15), in which the lens is provided for each of the openings.

(17) The light-emitting device according to any one of (1) to (16), in which the lens includes a spherical lens, a Fresnel lens, a trapezoidal lens, or a diffractive lens.

(18) The light-emitting device according to any one of (1) to (17), in which the light-emitting element includes an inorganic compound semiconductor or an organic compound semiconductor.

(19) An image display device including a plurality of arrays of light-emitting devices, in which the light-emitting device includes a light-emitting element having a light-emitting surface, a light-reflective section that reflects light emitted from the light-emitting surface, the light-reflective section being provided on an opposite side from the light-emitting surface of the light-emitting element and a side-surface side of the light-emitting element, a lens that collects the light emitted from the light-emitting surface, the lens being provided on the light-emitting-surface side, and a light-shielding section that blocks the light emitted from the light-emitting surface, the light-shielding section being provided between the light-emitting surface and the lens and having an opening to admit light, the opening penetrating the light-shielding section in a thickness direction.

(20) The image display device according to (19), in which in each of the light-emitting devices, array pitch of the light-emitting elements is identical to array pitch of the lenses.

The present application claims the benefit of Japanese Priority Patent Application JP2021-125300 filed with the Japan Patent Office on Jul. 30, 2020, the entire contents of which are incorporated herein by reference.

It should be understood by those skilled in the art that various modifications, combinations, sub-combinations and alternations may occur depending on design requirements and other factors insofar as they are within the scope of the appended claims or the equivalents thereof.

The invention claimed is:

1. A light-emitting device, comprising:

a light-emitting element having a light-emitting surface;

a light-reflective section configured to reflect light emitted from the light-emitting surface, wherein the light-reflective section is on an opposite side from the light-emitting surface of the light-emitting element and a side-surface side of the light-emitting element;

a first lens configured to collect the light emitted from the light-emitting surface, wherein the first lens is on a light-emitting-surface side;

a light-shielding section configured to block the light emitted from the light-emitting surface, wherein the light-shielding section is between the light-emitting surface and the first lens, the light-shielding section having an opening to admit the light, and the opening penetrates the light-shielding section in a thickness direction; and a second lens configured to collect the light emitted from the light-emitting surface, wherein the second lens is between the light-emitting surface and the light-shielding section.

2. The light-emitting device according to claim 1, further comprising:

a light control section configured to control at least one of wavelength, scattering, or direction of light, wherein the light control section is provided on the light-emitting-surface side in a region surrounded by the light-reflective section.

3. The light-emitting device according to claim 2, further comprising:

a wavelength cutoff filter between the light-emitting surface and the light control section.

4. The light-emitting device according to claim 2, wherein the light control section includes optical wavelength conversion material.

5. The light-emitting device according to claim 2, wherein the light control section includes a light-scattering body.

6. The light-emitting device according to claim 1, wherein the opening has an opening size that is larger than 10 nm and smaller than a diameter of the first lens and a light-emitting diameter of the light-emitting surface, and the light-emitting diameter is smaller than or equal to the diameter of the first lens.

7. The light-emitting device according to claim 1, wherein the light-reflective section includes:

a first light-reflective section on the opposite side from the light-emitting surface of the light-emitting element, a second light-reflective section on the side-surface side of the light-emitting element, and a third light-reflective section on the light-emitting-surface side of the light-shielding section, wherein the third light-reflective section is configured to reflect the light.

8. The light-emitting device according to claim 7, wherein the third light-reflective section is a flat surface, a scattering surface, or a curved surface.

9. The light-emitting device according to claim 1, wherein the opening has an opening edge that is a surface perpendicular to the light-emitting surface or an inclined surface with an opening size radially enlarged toward the first lens.

10. The light-emitting device according to claim 9, wherein the opening edge includes a fourth light-reflective section is configured to reflect the light.

11. The light-emitting device according to claim 1, further comprising:

a wavelength cutoff filter between the light-shielding section and the first lens.

12. The light-emitting device according to claim 1, wherein the opening has a circular shape, an oval shape, a square shape, a rectangular shape, a triangular shape, or a polygonal shape including pentagonal and polygonal shapes of higher sides than the pentagonal when viewed from the first lens.

13. The light-emitting device according to claim 1, wherein an optical axis of the light emitted from the light-emitting surface is identical to a center of the opening.

14. The light-emitting device according to claim 1, wherein the light-shielding section has a plurality of openings.

15. The light-emitting device according to claim 14, wherein the first lens is for each of the plurality of openings.

16. The light-emitting device according to claim 1, wherein the first lens includes a spherical lens, a Fresnel lens, a trapezoidal lens, or a diffractive lens.

17. The light-emitting device according to claim 1, wherein the light-emitting element includes an inorganic compound semiconductor or an organic compound semiconductor.

18. An image display device, comprising:

a plurality of arrays of light-emitting devices, wherein each of the light-emitting devices includes:

a light-emitting element having a light-emitting surface;

a light-reflective section configured to reflect light emitted from the light-emitting surface, wherein the light-reflective section is on an opposite side from the light-emitting surface of the light-emitting element and a side-surface side of the light-emitting element;

a first lens configured to collect the light emitted from the light-emitting surface, wherein the first lens is on a light-emitting-surface side;

a light-shielding section configured to block the light emitted from the light-emitting surface, wherein the light-shielding section is between the light-emitting surface and the first lens and having an opening to admit the light, the opening penetrating the light-shielding section in a thickness direction; and a second lens configured to collect the light emitted from the light-emitting surface, wherein the second lens is between the light-emitting surface and the light-shielding section.

19. The image display device according to claim 18, wherein in each of the light-emitting devices, array pitch of the light-emitting element is identical to array pitch of the first lens.

* * * * *